United States Patent
Lu et al.

(10) Patent No.: US 9,231,505 B2
(45) Date of Patent: Jan. 5, 2016

(54) SIGNAL TRANSDUCER AND CONTROL SYSTEM COMPRISING THE SAME

(71) Applicant: Zhongshan Broad-Ocean Motor Co., Ltd., Zhongshan (CN)

(72) Inventors: Chuping Lu, Zhongshan (CN); Yong Zhao, Zhongshan (CN)

(73) Assignee: ZHONGSHAN BROAD-OCEAN MOTOR CO., LTD., Zhongshan (CN)

( * ) Notice: Subject to any disclaimer, the term of this patent is extended or adjusted under 35 U.S.C. 154(b) by 355 days.

(21) Appl. No.: 13/775,234

(22) Filed: Feb. 24, 2013

(65) Prior Publication Data

US 2013/0241455 A1 Sep. 19, 2013

(30) Foreign Application Priority Data

Mar. 16, 2012 (CN) .......................... 2012 1 0071468

(51) Int. Cl.
*H02K 29/12* (2006.01)
*H02P 6/00* (2006.01)
*H02P 6/14* (2006.01)
*H02P 25/04* (2006.01)
*H05K 9/00* (2006.01)

(52) U.S. Cl.
CPC *H02P 6/14* (2013.01); *H02P 6/003* (2013.01); *H02P 25/04* (2013.01); *H02P 6/008* (2013.01); *H05K 9/0058* (2013.01)

(58) Field of Classification Search
CPC ........... H02P 6/14; H02P 6/003; H02P 6/008; H02P 25/04; H05K 9/0058
USPC ................. 318/400.37, 463, 400.01–400.41, 318/254.2, 254.1, 503, 565, 721; 322/21; 388/800; 701/22, 102, 51, 58, 2, 29, 701/31.4, 36, 53, 55, 60
See application file for complete search history.

(56) References Cited

U.S. PATENT DOCUMENTS

| 4,857,814 | A | * | 8/1989 | Duncan .......................... 318/281 |
| 5,075,608 | A | * | 12/1991 | Erdman et al. ................. 318/599 |
| 7,466,089 | B2 | * | 12/2008 | Beifus .......................... 318/254.1 |
| 2008/0037962 | A1 | * | 2/2008 | Peng et al. ..................... 388/838 |
| 2011/0140644 | A1 | * | 6/2011 | Jeung ................... H05K 9/0058 318/400.24 |
| 2011/0260671 | A1 | * | 10/2011 | Jeung ........................... 318/701 |

* cited by examiner

*Primary Examiner* — Bentsu Ro
*Assistant Examiner* — Zemenay Truneh
(74) *Attorney, Agent, or Firm* — Matthias Scholl, PC; Matthias Scholl

(57) ABSTRACT

A control system for electrical equipment, the system including: a system controller; a motor; and a signal transducer. The system controller outputs a plurality of rotation switch signals, and the rotation switch signals are high-voltage AC signals. The motor is a brushless DC motor or electronically commutated motor (ECM). The signal transducer is connected between the system controller and the ECM, and includes a rotation switch sensing circuit, a microprocessor controller, and an interface signal processing circuit. The rotation switch sensing circuit detects the rotation switch signals output from the system controller, and transmits the rotation switch signals to the microprocessor controller for processing. The microprocessor controller is connected with the ECM via the interface signal processing circuit.

6 Claims, 4 Drawing Sheets

SIGNAL TRANSDUCER AND CONTROL SYSTEM COMPRISING THE SAME

CROSS-REFERENCE TO RELATED APPLICATIONS

Pursuant to 35 U.S.C. §119 and the Paris Convention Treaty, this application claims the benefit of Chinese Patent Application No. 201210071468.0 filed Mar. 16, 2012, the contents of which, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a signal transducer and a control system for electrical equipment comprising the same.

2. Description of the Related Art

In recent years, as competitions in the electrical equipment field becomes more and more fierce, there is a high demand on the performance index of products, for example, products are required to be energy-conserving and environmentally friendly, to have high level of controllability and intelligence, and shortened development period. A motor is the core and critical part to solve above technical matters. A typical control system for electrical equipment in the prior art, as shown in FIG. 1, includes a system controller and a motor. The system controller outputs a plurality of rotation switch signals to control a single-phase AC motor PSC (Permanent Split Capacitor). The rotation switch signals are high-voltage AC signals (for example, 220 V AC signals, 115 V AC signals, and so on), and the motor is a single-phase AC motor that has low efficiency, relatively high energy consumption, big noise, and low level of controllability and intelligence.

With the development of the motor technology, a brushless DC motor has been developed. The brushless DC motor, also called electronically commutated motor (ECM), is energy-conserving and environmentally friendly, and has high level of reliability of controllability, small noise, and high intelligence. However, if the blushless DC motor is directly used to take the place of the original single phase AC motor of the control system of the electrical equipment, a new set of AC control system compatible with the brushless DC motor must be developed, which would bring up inconvenience to the customers, increase the production cost, prolong the development period, and thus impede the popularization of the technical scheme.

In addition, as different control systems of electrical equipment have different control parameters, in order to apply the control system in a broad field, different types of interface signals, rotational speed values, directions of rotation, control modes, operating voltages, and so on must be defined properly to an ECM, which improves the production cost.

SUMMARY OF THE INVENTION

In view of the above-described problems, it is one objective of the invention to provide a control system for electrical equipment. The control system adopts a high efficiency energy saving ECM to replace a conventional signal phase AC motor PSC. The invention does not change the original control lines of the control system of the electrical equipment, thereby saving the development and usage costs and shortening the development period. The control system makes full use of the brushless DC motor to improve the performance of electrical equipment, and has programmable and self-defining interface types, direction of rotation, control mode, and operating voltage, and so on. Thus, the control system is flexible in use and adaptability, and easy for popularization.

It is another objective of the invention to provide a signal transducer that has a simple circuit structure, programmable and self-defining interface types, direction of rotation, and control mode, and thus the signal transducer is flexible in use and adaptability, and easy for popularization.

To achieve the above objective, in accordance with one embodiment of the invention, there is provided a control system for electrical equipment comprising a system controller and a motor. The system controller outputs a plurality of rotation switch signals, and the rotation switch signals are high-voltage AC signals. The motor is a brushless DC motor, which is short for ECM. A signal transducer is connected between the system controller and the ECM. The signal transducer comprises a rotation switch sensing circuit, a microprocessor controller, and an interface signal processing circuit. The rotation switch sensing circuit detects the rotation switch signals output from the system controller, and transmits the rotation switch signals to the microprocessor controller for processing. The microprocessor controller is connected with the ECM via the interface signal processing circuit.

In a class of this embodiment, the rotation switch sensing circuit comprises a plurality of optical coupling isolation circuits.

In a class of this embodiment, the microprocessor controller is further connected with a communication port, through the communication port the microprocessor is connected with a host computer, and the host computer determines by programming a type of interface signal between the microprocessor controller and the ECM, a rotational speed value of each gear, a direction of rotation, a control mode, and an operating voltage of the ECM.

In a class of this embodiment, the microprocessor controller is further connected with a group of dial switches, the microprocessor controller reads a combination state of the group of dial switches, and determines a type of interface signal between the microprocessor controller and the ECM, a rotational speed value of each gear, a direction of rotation, a control mode, and an operating voltage of the ECM.

In a class of this embodiment, the interface signal between the microprocessor controller and the ECM is a pulse width modulation (PWM) signal, a digital signal, a voltage analog signal at low voltage, a current analog signal at low voltage, a switch signal, or a combination thereof.

A signal transducer used in a control system for electrical equipment comprises a rotation switch sensing circuit, a microprocessor controller, and an interface signal processing circuit. The rotation switch sensing circuit detects a plurality of rotation switch signals output from a system controller, and transmits the rotation switch signals to the microprocessor controller for processing, and the microprocessor controller is connected with an ECM via the interface signal processing circuit.

In a class of this embodiment, the rotation switch sensing circuit comprises a plurality of optical coupling isolation circuits.

In a class of this embodiment, the microprocessor controller is further connected with a communication port, through the communication port the microprocessor is connected with a host computer, and the host computer determines by programming a type of interface signal between the microprocessor controller and the ECM, a rotational speed value of each gear, a direction of rotation, a control mode, and an operating voltage of the ECM.

In a class of this embodiment, the microprocessor controller is further connected with a group of dial switches, the microprocessor controller reads a combination state of the group of dial switches, and determines a type of interface signal between the microprocessor controller and the ECM, a rotational speed value of each gear, a direction of rotation, a control mode, and an operating voltage of the ECM.

In a class of this embodiment, the interface signal between the microprocessor controller and the ECM is a pulse width modulation (PWM) signal, a digital signal, a voltage analog signal at low voltage, a current analog signal at low voltage, a switch signal, or a combination thereof.

Advantages of the invention are summarized below:
1) the ECM is employed to replace the original single phase AC motor (PSC), the signal transducer is connected between the system controller and the ECM, and the signal transducer functions as a bridge; there is no need to replace the system controller; thus the ECM can be used in a broad field, and the controller system of electrical equipment is energy-conserving and environmentally friendly, has high level of controllability and intelligence, good speed governing, reliability, convenient usage and easy popularization;
2) the microprocessor controller is connected with the communication port, through which the microprocessor controller is connected with the host computer, the host computer determines the type of interface signal between the microprocessor controller and the ECM, the rotational speed value of each gear, the direction of rotation, the control mode, and the operating voltage;
3) the microprocessor controller is further connected with the group of dial switches, the microprocessor controller reads a combination state of the group of dial switches, and determines the type of interface signal between the microprocessor controller and the ECM, the rotational speed value of each gear, the direction of rotation, the control mode, and the operating voltage, thus, the control system is flexible in use and adaptability; and
4) the rotation switch sensing circuit comprises a plurality of optical coupling isolation circuits, which have a simple structure.

DETAILED DESCRIPTION OF THE EMBODIMENTS

Figure 1:
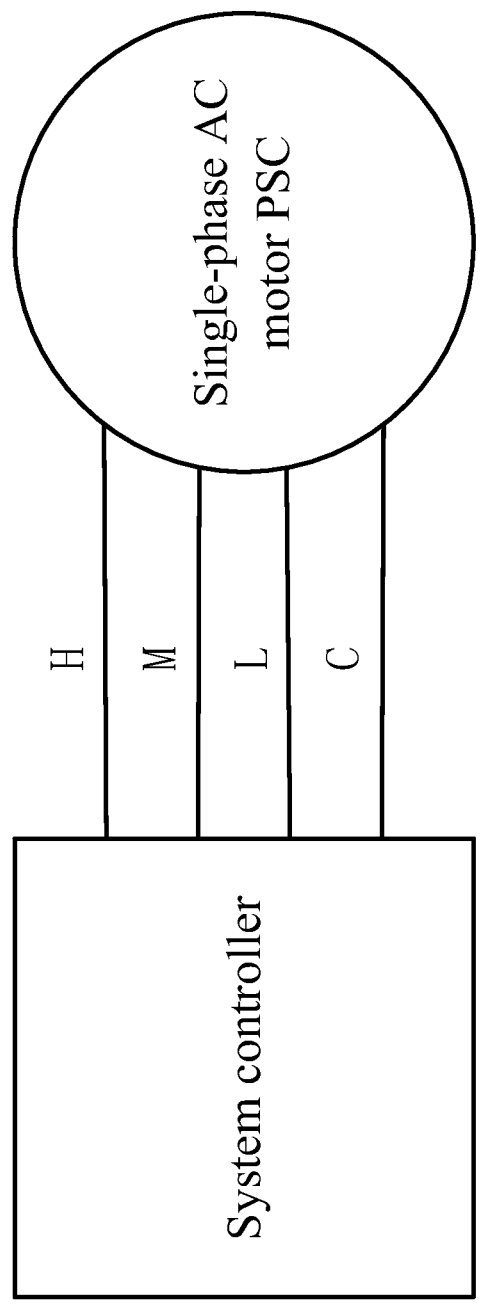
FIG. 1 is a control diagram of a control system of conventional electronic equipment.
Figure 2:
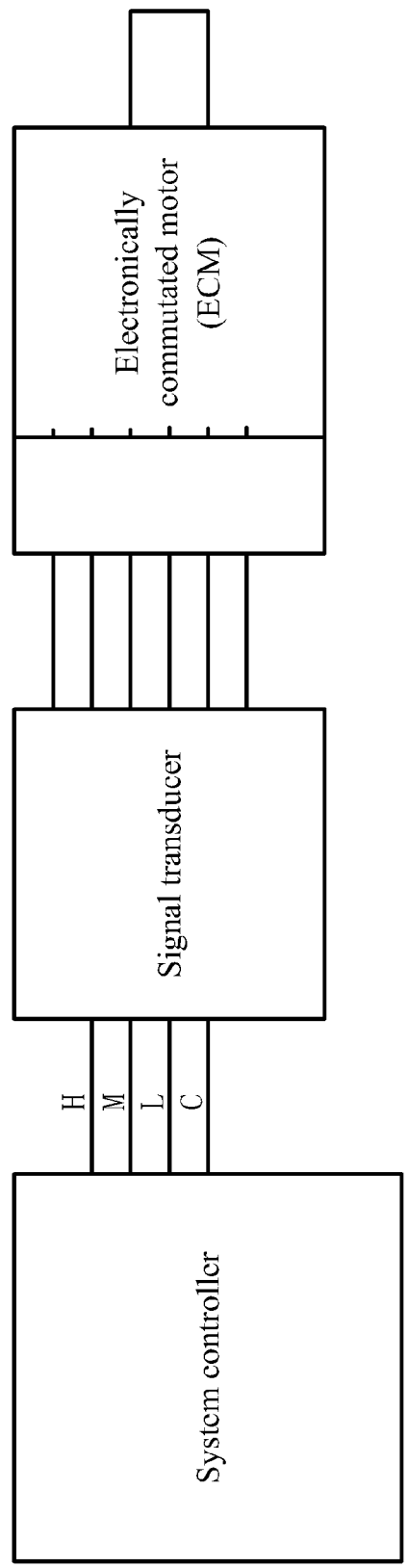
FIG. 2 is a schematic diagram of a control system for electrical equipment in accordance with one embodiment of the invention.
Figure 3:
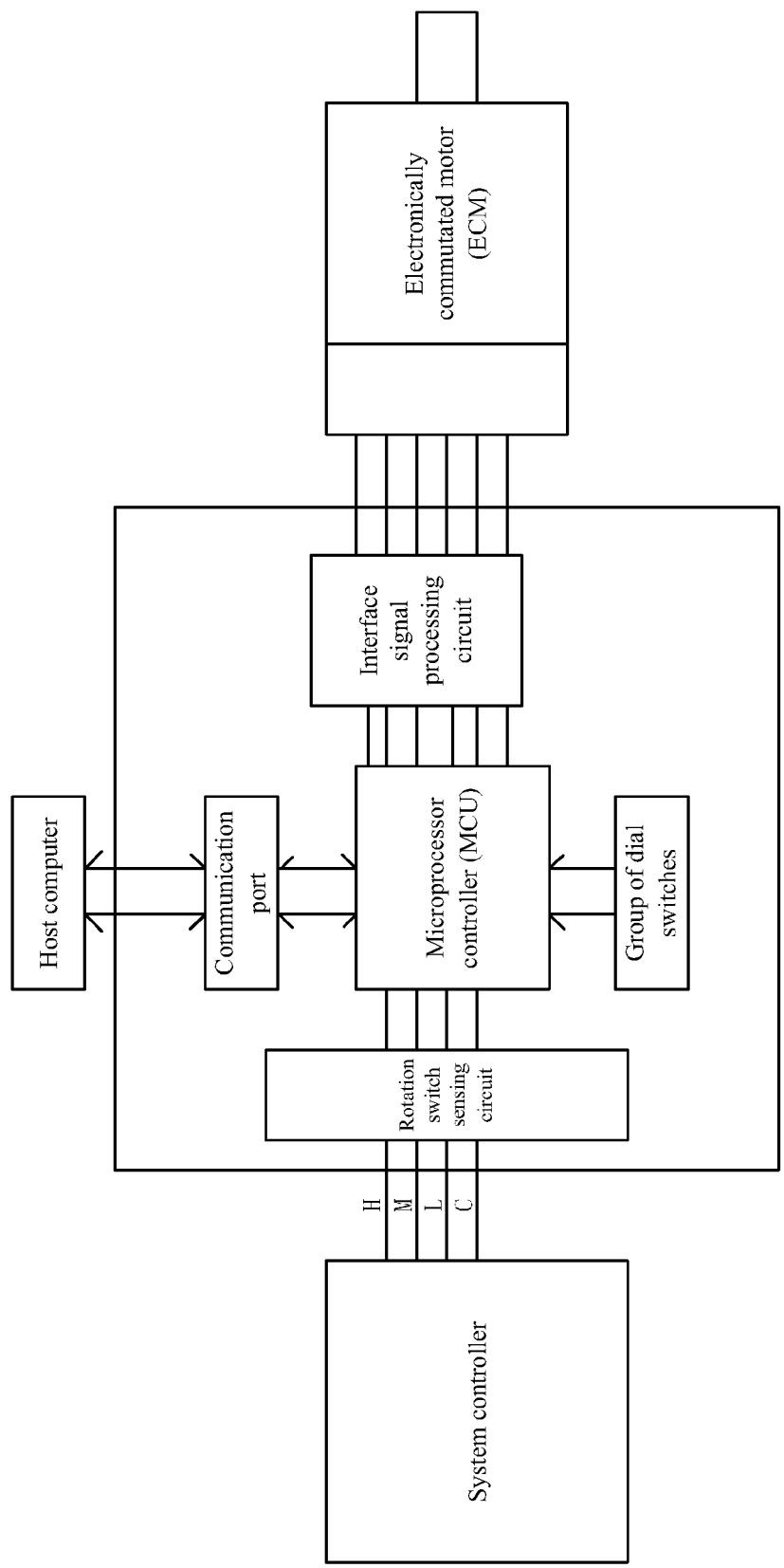
FIG. 3 is a circuit block diagram of a control system for electrical equipment in FIG. 2.
Figure 4:
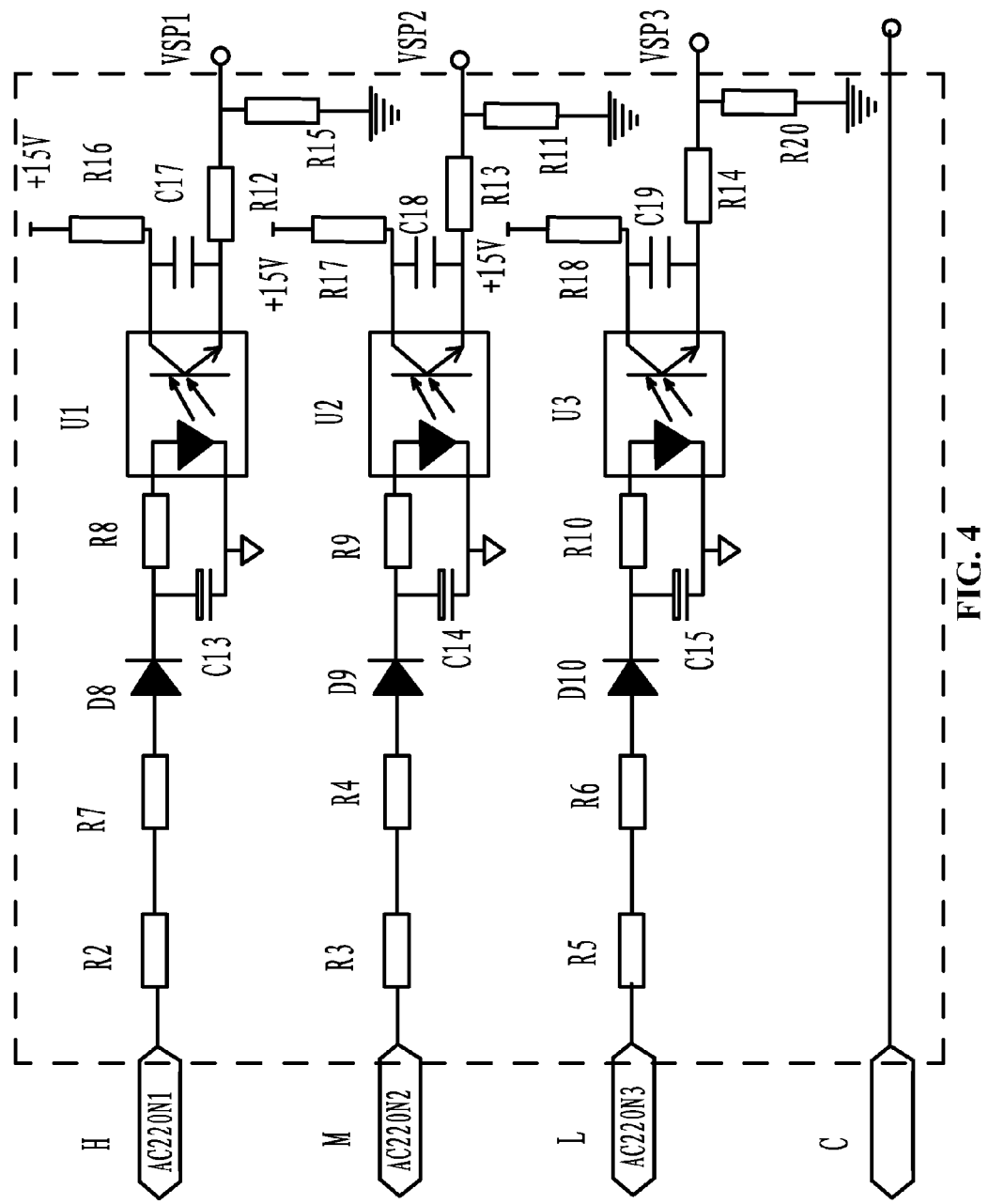
FIG. 4 is a circuit diagram of a rotation switch sensing circuit in accordance with one embodiment of the invention.

As shown in FIGS. 2 and 3, a control system for electrical equipment, comprises a system controller and a motor. The system controller outputs a plurality of rotation switch signals, and the rotation switch signals are high-voltage AC signals. The motor is a brushless DC motor, which is short for ECM. A signal transducer is connected between the system controller and the ECM. The signal transducer comprises a rotation switch sensing circuit, a microprocessor controller, and an interface signal processing circuit. The rotation switch sensing circuit detects the rotation switch signals output from the system controller, and transmits the rotation switch signals to the microprocessor controller for processing. The microprocessor controller is connected with the ECM via the interface signal processing circuit. The rotation switch sensing circuit comprises a plurality of optical coupling isolation circuits. The microprocessor controller is further connected with a communication port, through which the microprocessor is connected with a host computer (PC computer). The host computer determines by programming a type of interface signal between the microprocessor controller and the ECM, a rotational speed value of each gear, a direction of rotation, a control mode, and an operating voltage of the ECM. The microprocessor controller is further connected with a group of dial switches, the microprocessor controller reads a combination state of the group of dial switches, and determines the type of interface signal between the microprocessor controller and the ECM, the rotational speed value of each gear, the direction of rotation, the control mode, and the operating voltage of the ECM. The interface signal between the microprocessor controller and the ECM is a PWM signal, a digital signal, a voltage analog signal at low voltage, a current analog signal at low voltage, a switch signal, or a combination thereof. As shown in FIG. 4, a rotation switch sensing circuit mainly comprises resistors R2, R3, R4, R5, R6, R7, R8, R9, R10, R11, R12, R13, R14, R15, R16, R17, R18, and R20; capacitors C13, C14, C15, C17, C18, C19; rectifier diodes D8, D9, D10; and optoelectronic isolators U1, U2, U3. The rotation switch sensing circuit is mainly used to detect whether a plurality of the rotation switches are close, when the rotation switches are close, then a signal is detected by the rotation switch sensing circuit, and the rotation switch signal is then input to the microprocessor controller. The interface signal processing circuit comprises: a D/A converting circuit, a level converting drive circuit, a RS485 serial interface circuit, and a RS232 serial interface circuit, and so on.

Principle of the invention is as follows: 1) the operating voltage of the ECM can be selected as 115 V, 230 V, or 460 V by a jumper of the signal transducer, or be set as 115 V, 230 V, or 460 V by the program of the host PC computer, or be set as 115 V, 230 V, or 460 V according to the combination state of the group of dial switches read by the microprocessor controller MCU; 2) the control mode comprises three types, that is, a constant rotational speed mode, a constant air volume mode, and a constant torque mode.

Example 1

An interface type between an ECM and a signal transducer is summarized as follows, and 8 ports are employed, which comprise:

M1: an input port of power supply, 10-35 VDC;

M2: a port of mode selection, through which signals are input from the signal transducer to the ECM, and a constant air volume mode is employed at high level and a constant rotational speed mode employed at low level;

M3: a PWM signal port, which inputs PWM signals having a certain frequency to the ECM, and the signals are rotary speed/torque control command of the motor;

M4: a R/T port for data transmission between the ECM and the signal transducer, in which a bidirectional asynchronous half-duplex communication data line is employed, and voltage direct current (VDC) is employed at high level and signal ground (SG) is employed at low level;

M5: a port of component object mode (COM), which is a ground line of signal lines and a common terminal of control signals;

M6: a port for fault signal output, through which the ECM outputs a fault signal to the signal transducer under error state, and the motor is under error state at high level, and under normal state at low level;

M7: a port of power indication, through which the ECM outputs PMW power signals to the signal transducer using an open collector (OC); the power is calculated by duty cycle of PWM; and M8: a port of speed feedback, through which the ECM outputs speed signals to the signal transducer using the open collector (OC); the speed signal is calculated based on output pulse number per rotation.

Example 2

An interface type between an ECM and a signal transducer is summarized as follows, and 8 ports are employed, which comprise:

M1: the signal transducer inputs switch signals to the ECM, a voltage ranges from 0-24 V;

M2: the signal transducer inputs switch signals to the ECM, a voltage ranges from 0-24 V;

M3: the signal transducer inputs switch signals to the ECM, a voltage ranges from 0-24 V;

M4: the signal transducer inputs switch signals to the ECM, a voltage ranges from 0-24 V;

M5: the signal transducer inputs switch signals to the ECM, a voltage ranges from 0-24 V;

Mode: a port for mode selection, through which signals are input from the signal transducer to the ECM, and a constant air volume mode is employed at high level and a constant rotational speed mode employed at low level;

G2: a common port of switch signals; and

R/T: a port for data transmission between the ECM and the signal transducer, in which a bidirectional asynchronous half-duplex communication data line is employed.

Example 3

A microprocessor controller is connected with a group of dial switches. The microprocessor controller reads a combination state of the group of dial switches, and determines a type of interface signal between the microprocessor controller and the ECM, a rotational speed value of each gear, a direction of rotation, a control mode, and an operating voltage of the ECM. For example, the group of dial switches comprises 8 single switches, each switch selects from 0 or 1, thus, it can be deduced that the group of dial switches has a total of 512 combinations. Supposing that, the microprocessor controller reads the group of dial switches as 10010011, the read number represents an operating voltage of the motor of 230 VAC, a rotational speed of 1250 rpm, a state of constant torque, and a forward rotation. Then, the microprocessor controller sends corresponding instructions to the ECM. Under the control of the microprocessor controller, the ECM operates in the set sate after initialization of interface types. For another example, the microprocessor controller reads the group of dial switches as 10010000, the read number represents an operating voltage of the motor of 115 VAC, a rotational speed of a first gear of 1500 rpm, a rotational speed of a second gear of 1200 rpm, a rotational speed of a third gear of 1000 rpm, a state of constant torque, and a reverse rotation. Then, the microprocessor controller sends corresponding instructions to the ECM. Under the control of the microprocessor controller, the ECM operates in the set sate after initialization of interface types. Thus, the selection of different operating state of the ECM is achieved by setting the group of dial switches.

Optionally, a host computer (PC computer) is employed to determine by programming a type of interface signal between the microprocessor controller and the ECM, a rotational speed value of each gear, a direction of rotation, a control mode, and an operating voltage of the ECM.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A signal transducer, comprising:
    a) a rotation switch sensing circuit;
    b) a microprocessor controller;
    c) an interface signal processing circuit; and
    d) a plurality of dial switches each comprising an on-off state;
    wherein:
    the rotation switch sensing circuit detects a plurality of rotation switch signals output from a system controller, and transmits the rotation switch signals to the microprocessor controller, and the microprocessor controller is adapted to be connected with an external electronically commutated motor via the interface signal processing circuit;
    the microprocessor controller is connected to the plurality of dial switches; and
    the microprocessor controller is adapted to determine a type of interface signal between the microprocessor controller and the external electronically commutated motor, a rotational speed value of the external electronically commutated motor, a direction of rotation of the external electronically commutated motor, a control mode of the external electronically commutated motor, and an operating voltage of the external electronically commutated motor according to the on-off states of the plurality of dial switches.

2. The signal transducer of claim 1, wherein the rotation switch sensing circuit comprises a plurality of optical coupling isolation circuits.

3. The signal transducer of claim 2, wherein an interface signal between the microprocessor controller and the external electronically commutated motor is a pulse width modulation (PWM) signal, a digital signal, a voltage analog signal at low voltage, a current analog signal at low voltage, a switch signal, or a combination thereof.

4. The signal transducer of claim 1, wherein the microprocessor controller is connected with a communication port, through the communication port the microprocessor is connected with a host computer, and the host computer determines by programming the type of interface signal between the microprocessor controller and the external electronically commutated motor, the rotational speed value of the external electronically commutated motor, the direction of rotation of the external electronically commutated motor, the control mode of the external electronically commutated motor, and the operating voltage of the external electronically commutated motor ECM.

5. The signal transducer of claim 4, wherein an interface signal between the microprocessor controller and the external electronically commutated motor is a pulse width modulation (PWM) signal, a digital signal, a voltage analog signal at low voltage, a current analog signal at low voltage, a switch signal, or a combination thereof.

6. The signal transducer of claim 1, wherein an interface signal between the microprocessor controller and the external electronically commutated motor is a pulse width modulation (PWM) signal, a digital signal, a voltage analog signal at low voltage, a current analog signal at low voltage, a switch signal, or a combination thereof.

* * * * *